United States Patent
Adetutu et al.

[19]

[11] Patent Number: 5,958,508
[45] Date of Patent: Sep. 28, 1999

[54] PROCESS FOR FORMING A SEMICONDUCTOR DEVICE

[75] Inventors: Olubunmi Olufemi Adetutu, Austin; Dean J. Denning, Del Valle; James D. Hayden, Austin; Chitra K. Subramanian, Austin; Arkalgud R. Sitaram, Austin, all of Tex.

[73] Assignee: Motorlola, Inc., Schaumburg, Ill.

[21] Appl. No.: 08/828,635

[22] Filed: Mar. 31, 1997

[51] Int. Cl.[6] .......................... C23C 16/00; H01L 21/285
[52] U.S. Cl. ..................... 427/248.1; 427/255.7; 427/314; 438/585; 438/592; 204/192.15
[58] Field of Search ................. 427/248.1, 314, 427/255.7; 204/192.15; 438/585, 592

[56] References Cited

U.S. PATENT DOCUMENTS

| | | | |
|---|---|---|---|
| 4,490,209 | 12/1984 | Hartman | 156/643 |
| 4,684,542 | 8/1987 | Jasinski et al. | 437/245 |
| 4,977,100 | 12/1990 | Shimura | 437/44 |
| 5,066,615 | 11/1991 | Brady et al. | 437/229 |
| 5,200,028 | 4/1993 | Tatsumi | 156/656 |
| 5,364,803 | 11/1994 | Lur et al. | 437/40 |
| 5,441,914 | 8/1995 | Taft et al. | 437/189 |
| 5,559,047 | 9/1996 | Urabe | 437/41 |
| 5,616,948 | 4/1997 | Pfiester | 257/412 |

FOREIGN PATENT DOCUMENTS

| | | |
|---|---|---|
| 01-047050 | 2/1989 | Japan . |
| 07-263674 | 10/1995 | Japan . |

OTHER PUBLICATIONS

Akasaka, et al.; "Low–Resistivity Poly–Metal Gate Electrode Durable for High–Temperature Processing"; IEEE Transactions on Electron Devices; vol. 43, No. 11; pp. 1864–1868; (1996) no month.

Kasai, et al.; "W/WNx/Poly–Si Gate Technology for Future High Speed Deep Submicron CMOS LSIs"; IEDM; pp. 497–500 (1994) no month.

Reid, et al.; Evaluation of amorphous (Mo, Ta, W)–Si–N diffusion barriers for <Si>ICu metallizations; Thin Solid Films, vol. 236; pp. 319–324; (1993) No month.

Chiou, et al.; "Microstructure and Properties of Multilayer–Derived Tungsten Silicide"; Journal of Electronic Materials, vol. 16; No. 4; pp. 251–255 (1987) No Month.

He, et al.; "Microstructure and properties of Ti–Si–N films prepared by plasma–enhanced chemical vapor deposition"; Materials Chemistry and Physics; 44; pp. 9–16 (1996) No month.

Shizhi, et al.; "Ti–Si–N Films Prepared by Plasma–Enhanced Chemical Vapor Deposition"; Plasma Chemistry and Plasma Processing; vol. 12, No. 3; pp. 287–297 (1992) no month.

Wright, et al.; "The Effect of Fluorine in Silicon Dioxide Gate Dielectrics"; IEEE Transactions of Electron Devices; vol. 36, No. 5; pp. 879–889 (1989) No month.

*Primary Examiner*—Roy V. King
*Attorney, Agent, or Firm*—George R. Meyer

[57] ABSTRACT

A metal-semiconductor layer (26) is formed over an insulating layer (20) such that the metal-semiconductor layer (26) is graded to have varying amounts of the semiconductor and metal throughout the layer. In one embodiment, the metal-semiconductor layer (26) has relatively higher silicon content near the layer's lower and upper surfaces. At the midpoint, the layer is close to stoichiometric tungsten silicide. In another embodiment, a metal-semiconductor-nitrogen layer is formed having nitrogen nearer the lower surface and essentially no nitrogen near the upper surface. The layer (26) can be formed using chemical vapor deposition or sputtering.

20 Claims, 2 Drawing Sheets

PROCESS FOR FORMING A SEMICONDUCTOR DEVICE

RELATED APPLICATIONS

This is related to U.S. patent application Ser. No. 08/459,198 filed on Jun. 2, 1995, now U.S. Pat. No. 5,616,948, assigned to the current assignee hereof. This is also related to U.S. patent application Ser. Nos. 08/828,638 (now U.S. Pat. No. 5,888,588), 08/829,405 (now abandoned), 08/829,752, 08/831,286 and 08/831,287, all filed of even date, assigned to the current assignee hereof.

FIELD OF THE INVENTION

This invention relates in general to processes for forming semiconductor devices, and more particularly, processes for forming semiconductor devices with metal-semiconductor layers.

BACKGROUND OF THE INVENTION

In many very large scale integration (VLSI) semiconductor devices, polycrystalline silicon (polysilicon) gates are formed over a gate dielectric layer. Due to the relatively high resistance values of the polysilicon layer, a tungsten silicide layer is often formed to lower resistance along the polysilicon gate. Generally, the ratio of silicon to tungsten is approximately 2.6 to 1 within the tungsten silicide layer. To improve adhesion between the tungsten silicide layer and the polysilicon layer, the tungsten silicide layer can be silicon-rich and has a relatively uniform composition as deposited. However, an amorphous silicon layer is usually formed after the tungsten suicide layer and before a silicon nitride anti-reflective coating (ARC) to promote adhesion between the silicon nitride ARC and the tungsten silicide layer.

Currently, at least four layers are used to form a gate electrode stack including a doped polysilicon layer, a tungsten suicide layer, an amorphous silicon layer, and a silicon nitride ARC. The four layers require numerous processing steps to overcome problems associated with the lack of adhesion between the tungsten silicide layer and each of the polysilicon layer and the silicon nitride ARC.

Further, fluorine from the tungsten hexafluoride, which is used in forming the tungsten silicide, can cause thickening of the gate dielectric layer or a change in the dielectric constant of the gate dielectric layer. Control of these attributes is important to achieve a repeatable and predictable operation of the semiconductor device.

A need exists to form a metal-semiconductor layer using as little as one processing step to form a gate electrode. A need also exists to form the metal-semiconductor layer without causing thickening of the gate dielectric layer. Still another need exists to form the metal-semiconductor layer that has good adhesion to the gate dielectric layer. A need further exists to form the metal-semiconductor layer without having to develop complex processing steps or using unusual materials within a semiconductor fab.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A metal-semiconductor layer is formed over an insulating layer such that the metal-semiconductor layer is graded to have a varying amount of silicon and metal throughout the layer. In one embodiment, the metal-semiconductor layer is a silicon-rich tungsten suicide layer that has relatively higher silicon content near the layer's lower and upper surfaces. At the midpoint, the layer is close to stoichiometric tungsten silicide. As used herein, content of an element refers to the atomic concentration within a layer. The metal-semiconductor layer can be formed with readily available gases, such as tungsten hexafluoride ($WF_6$), tungsten hexacarbon monoxide ($W(CO)_6$), and tungsten hexachloride ($WCl_6$), titanium tetrachloride ($TiCl_4$), silane ($SiH_4$), dichlorosilane ($SiH_2Cl_2$), disilane ($Si_2H_6$), germane ($GeH_4$), and the like.

In another embodiment, a metal-semiconductor-nitrogen layer is formed having nitrogen nearer the lower surface and essentially no nitrogen near the upper surface.

The metal-semiconductor and metal-semiconductor-nitrogen layer can be formed using chemical vapor deposition or sputtering. The layers have sufficient adhesion to a subsequent formed silicon nitride layer. Therefore, an amorphous silicon adhesion layer is not required. The present invention is described in more detail with the embodiments that appear below.

Figure 1:
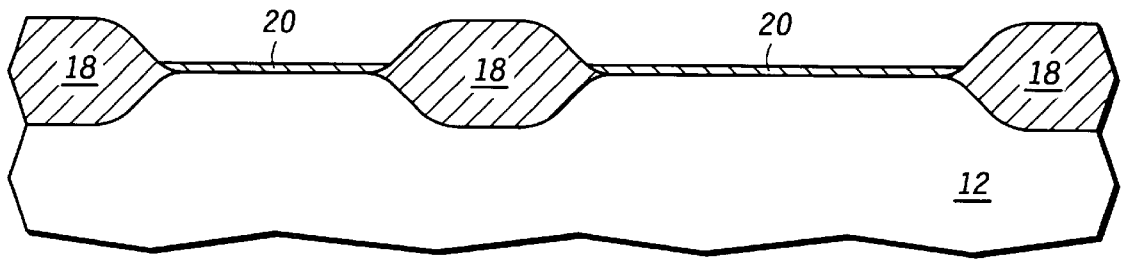
FIG. 1 includes an illustration of a cross-sectional view of a portion of a semiconductor device substrate after forming field isolation regions and a gate dielectric layer.

FIG. 1 includes an illustration of a portion of a semiconductor device substrate 12 that includes a monocrystalline semiconductor wafer, a semiconductor-on-insulator wafer, or any other substrate used to form semiconductor devices. Field isolation regions 18 and a gate dielectric layer 20 overlie the substrate 12. The field isolation regions 18 are formed by a selective oxidation process or a trench isolation process. The gate dielectric layer 20, which is an insulating layer, includes silicon dioxide, a nitrided oxide, or the like.

A silicon-rich tungsten silicide layer 26 and a silicon nitride layer 28 are formed over the gate dielectric layer 20 and field isolation regions 18. The silicon-rich tungsten silicide layer 26 is a metal-semiconductor layer and has a thickness in a range of approximately 500–3000 angstroms. In one embodiment, layer 26 is formed by chemical layer deposition using tungsten hexafluoride ($WF_6$) and silane ($SiH_4$) at a pressure less than 1 torr and at a temperature range of approximately 350 degrees Celsius to 475 degrees Celsius. A reactor capable of performing the deposition is a Centura 5200 platform having an xL Chamber and is made by Applied Materials, Inc. of Santa Clara, Calif.

In one embodiment, the silicon-rich tungsten silicide layer 26 is formed to be very silicon rich near the beginning and end of the deposition cycle and nearly stoichiometric tungsten silicide during a middle portion of the process. In one embodiment, the $SiH_4$ flow rate is kept relatively constant at approximately 400 standard cubic centimeters per minute (sccm). At the beginning of the deposition step, the $WF_6$ flow rate is approximately 0.1 sccm or lower and is gradually increased to approximately 6.0–7.0 sccm. Near the end of the deposition step, the $WF_6$ flow rate is decreased back to approximately 0.1 sccm or lower. In this manner, the midpoint of the layer 26 is essentially stoichionietric tungsten silicide. In this embodiment, the metal-semiconductor layer is more silicon-rich near the lower and upper surfaces compared to the middle portion. This allows better adhesion of the metal-semiconductor layer to both the underlying gate dielectric layer 20 and the subsequently formed silicon nitride layer 28.

In another embodiment, the metal-semiconductor layer is formed by sputter deposition using two targets, One target includes a metal, such as tungsten, and the second target includes silicon. The sputtering is performed to have a relatively higher concentration of silicon near the lower surface and near the upper surface compared to the middle. After a sputter deposition step, the layer may be annealed in a furnace or rapid thermal processor.

In still another embodiment, a nitrogen source gas is used in forming a metal-semiconductor-nitrogen layer. If a metal-semiconductor-nitrogen layer is formed, nitrogen is incorporated closer to the lower surface of layer 26 compared to its upper surface. With chemical vapor deposition, a nitrogen source gas including ammonia is used near the beginning of the deposition step but is terminated before the deposition is completed. By forming a metal-semiconductor-nitrogen layer, fluorine penetration to the gate dielectric layer 20 is reduced, thereby, decreasing the likelihood of gate dielectric layer thickening or changing the dielectric constant.

If the metal-semiconductor-nitrogen layer is sputtered, the metal-semiconductor-nitrogen layer is formed with the previously described targets using an ionized nitrogen-containing gas, such as nitrogen. As the sputtering continues, the nitrogen-containing gas is terminated and ionized argon gas is used to complete the sputtering process. With sputtering, an anneal step can be performed after the deposition is completed. Again, nitrogen within the metal-semiconductor-nitrogen layer is kept near the gate dielectric layer 20 and is not present within the metal-semiconductor-nitrogen layer near the silicon nitride ARC 28.

The metal-semiconductor layer includes tantalum, titanium, tungsten, cobalt, molybdenum, platinum, or the like. Refractory metal suicides and refractory metal silicon nitrides are most likely to be used because they can withstand temperature processing seen during subsequent processing steps.

Figure 2:
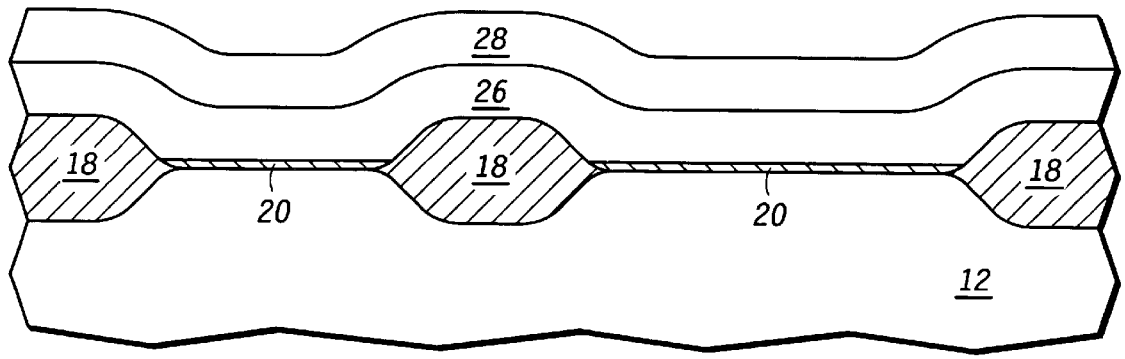
FIG. 2 includes an illustration of a cross-sectional view of the substrate of FIG. 1 after forming a silicon-rich tungsten silicide layer and a silicon nitride layer in accordance of one embodiment of the present invention.

The silicon nitride ARC 28 includes a stoiclhiometric silicon nitride layer, a silicon-rich silicon nitride layer, or a combination thereof. The silicon nitride ARC 28 is typically formed by chemical vapor deposition. A resist layer is then coated over the substrate and patterned to form a masking layer over the silicon nitride ARC 28, but is not shown in FIG. 2.

Figure 3:
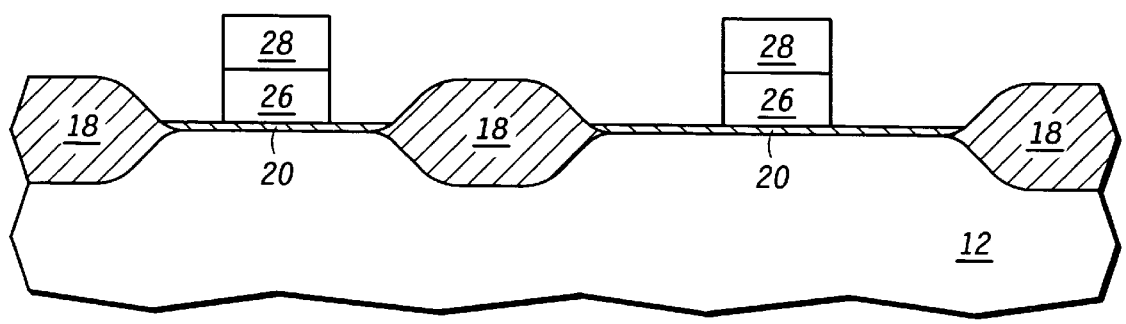
FIG. 3 includes an illustration of a cross-sectional view of the substrate of FIG. 2 after patterning the metal-semiconductor and silicon nitride layers to form gate electrodes.

The silicon nitride ARC 28 and the silicon-rich tungsten silicide layer 26 are then patterned to form gate electrodes that include layer 26. After the patterning step, the resist is removed to form the structure as illustrated in FIG. 3. The patterning step is performed using reactive ion etching including hydrogen bromide (HBr), sulfur hexafluoride ($SF_6$), or molecular chlorine ($Cl_2$), or a combination thereof.

Figure 4:
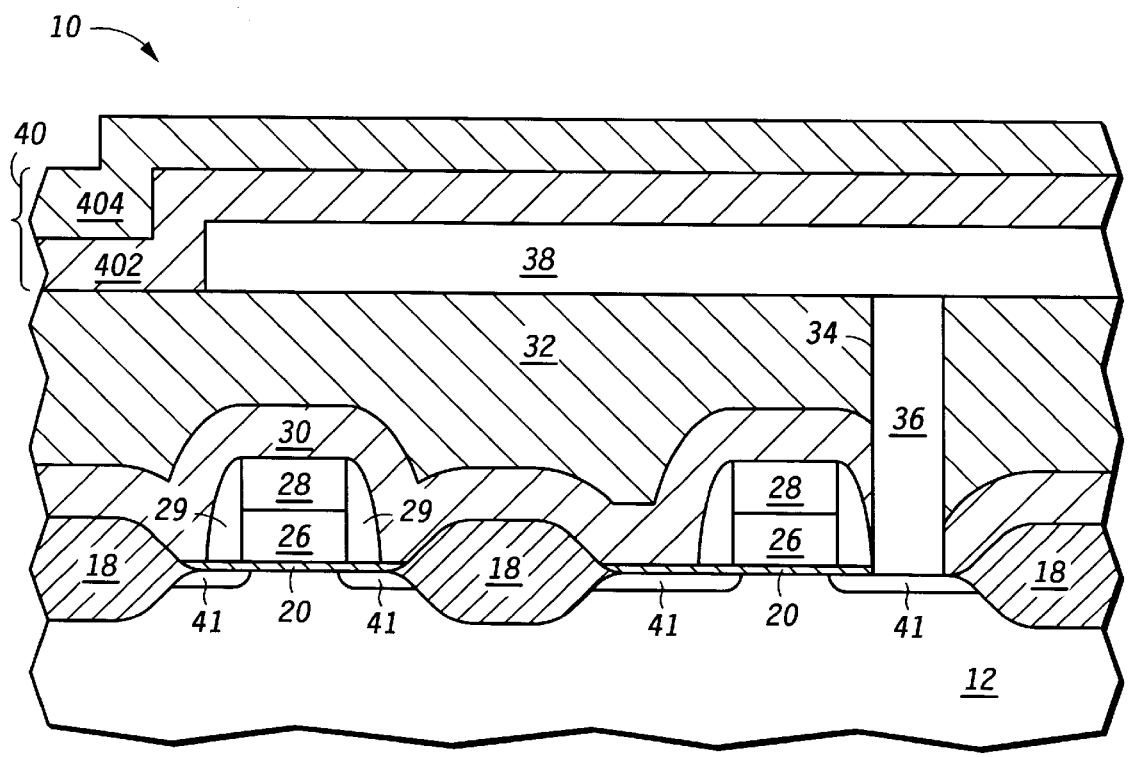
FIG. 4 includes an illustration of a cross-sectional view of the substrate of FIG. 3 after forming a substantially completed device.

The substrate is further processed to form a substantially completed semiconductor device 10 as shown in FIG. 4. Doped regions 41 are formed within the substrate 12 near remaining portions of layer 26. The doped regions 41 are source/drain regions (current electrodes) for the transistors shown. Silicon nitride spacers 29 are formed adjacent to the sides of the gate electrodes that include the metal-semiconductor layer 26. An undoped oxide layer 30 and a doped oxide layer 32 are then formed by chemical vapor deposition. The doped oxide is typically a borophosphosilicate glass (BPSG). The undoped and doped oxide layers 30 and 32 are patterned to form a contact opening 34. A conductive plug 36 is formed within the contact opening 34 and makes contact to one of the doped regions 41. Other conductive plugs are formed that contact the doped regions 41 or layer 26. The conductive plugs includes tungsten and adhesion/barrier layers, such as titanium/titanium nitride.

An interconnect layer 38 is formed over the doped oxide layer 32 and the conductive plug 36. The interconnect layer 38 typically includes aluminum, copper or the like and is typically formed with an adhesion/barrier layer or an antireflective coating. In one embodiment, the adhesion/barrier layer includes titanium/titanium nitride, and the antireflective coating includes titanium nitride. A passivation layer 40 is formed over the interconnect layer 38 and exposed portions of the doped oxide layer 32. The passivation layer 40 includes a doped oxide film 402 and a silicon nitride film 404. Bond pads are formed through the passivation layer 40, and the semiconductor device is subsequently packaged.

The metal-semiconductor layer 26 can be used to form gate electrodes within a memory array of semiconductor device 10. The memory array includes SRAM, DRAM, and flash nonvolatile memory. The memory array can be part of a stand alone memory device or part of a microprocessor, microcontroller, or the like.

Figure 5:
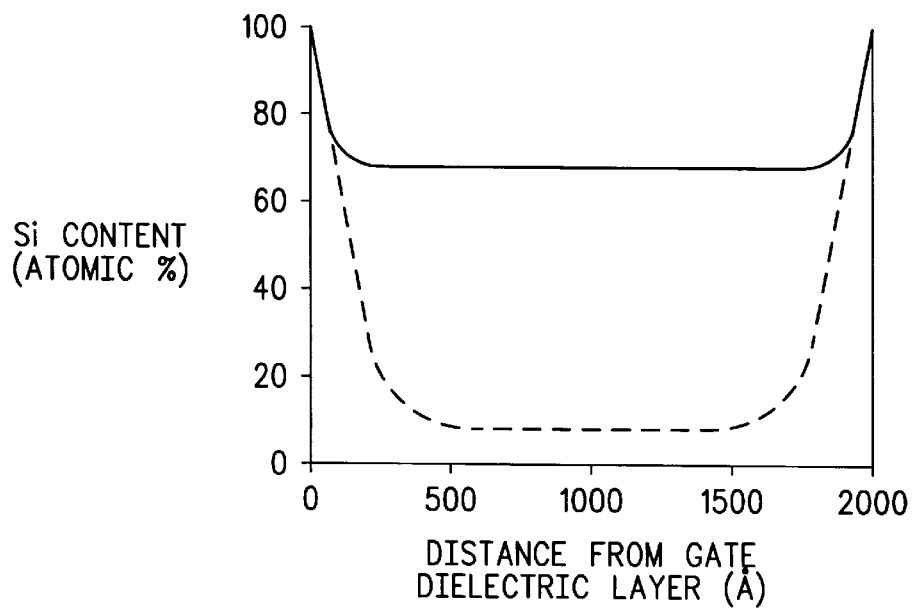
FIG. 5 includes a graph of silicon content within a tungsten silicide layer versus distance from the gate dielectric layer.

FIG. 5 is a plot showing how silicon content within the metal-semiconductor layer 26 changes as a function of distance from the gate dielectric layer 20. The portions of the layer 26 near its two surfaces are continuously graded. Locations within those portions are silicon-rich. The center portion that includes the midpoint of layer 26 is nearly stoichiometric tungsten silicide. The solid line in FIG. 5 depicts this type of composition. In another embodiment, all of layer 26 can be continuously graded and can even include a metal-rich portion. Referring to the dashed line in FIG. 5, layer 26 can be continuously graded and be tungsten rich at the midpoint of layer 26.

In still other embodiments, layer can be graded to include discrete portions, where each portion is of relatively uniform composition (not continuously graded within each portion). For example, if disilane ($Si_2H_6$) and $WF_6$ are used, a lower portion of the metal-semiconductor layer 26 that is mostly silicon, a middle portion that is nearly stoichiometric tungsten silicide, and an upper portion similar to the lower portion. The middle portion is approximately two to ten times thicker than each of the lower and upper portions. These three portions can be formed in the same reactor, during the same evacuation cycle, at approximately the same temperature and pressure. The composition would be modified by changing the gas flow rates of tungsten hexafluoride and silane. In addition, further discrete portions could be made to comprise nearly any finite number of discrete portions.

In yet a further embodiment, the grading could occur in an opposite direction. For example, the metal-semiconductor layer 26 could be graded such that it has a higher tungsten content near its upper surface. In this case, nearly stoichiometric tungsten silicide is formed near the silicon nitride surface. If adhesion is an issue, a very thin amorphous silicon layer could be formed over the metal silicon layer but is not shown in FIGS. 2–4.

The present invention includes benefits that are not seen with prior art methods. In one embodiment, a graded tungsten silicide layer has a much higher silicon content within the silicon-rich tungsten silicide layer 26 near the interface with the silicon nitride ARC 28. This allows the silicon nitride ARC 28 to adhere directly to a conductive film formed during one reactor cycle without having to use an amorphous silicon layer as a glue layer. Another benefit of the present invention is that the grading can be performed either continuously or as discrete portions. This allows tailoring of transistor characteristics to those specified by the device designers.

The formation of the metal-semiconductor layer during the single reactor cycle allows higher throughput because one deposition cycle in a single reactor is performed without interruptions. Additionally, the incorporation of nitrogen within the metal-semiconductor-nitrogen layer allows for less fluorine penetration that leads to gate dielectric layer thickening. Still another benefit of the present invention is that it may be performed without having to develop unusual processing steps or the use of extravagant or exotic materials that are not typically used in forming semiconductor devices. Additionally, the defect density of the substrate decreases as handling is also decreased.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:

forming an insulating layer over a semiconductor device substrate; and forming a first layer over the insulating layer, wherein:
   the first layer includes a semiconductor and a metal;
   the first layer has a first surface and a second surface that is further from the insulating layer compared to the first surface;
   the first layer has a first location, a second location, and a third location, wherein the first location is closest to the first surface, the third location is closest to the second surface, and the second location lies between the first and second surfaces; and
   within the first layer, a semiconductor content is selected from a group consisting of:
   essentially stoichiometric at the second location and above 80 atomic percent at the first location or the third location; and
   at most 60 atomic percent at the second location and at least stoichiometric at the first location or the third location.

2. The process of claim 1, wherein the semiconductor content at the first location is at least 80 atomic percent.

3. The process of claim 2, wherein:
   the first location lies within a first portion of the first layer and the second location lies within a second portion of the first layer;
   a metal content within the second portion is essentially stoichiometric and the metal content within the first portion is at most 20 atomic percent; and
   the second portion is in a range of approximately 2–10 times thicker than the first portion.

4. The process of claim 1, wherein the semiconductor content at the third location is at least 80 atomic percent.

5. The process of claim 4, wherein:
   the first location lies within a first portion of the first layer, the second location lies within a second portion of the first layer, and the third location lies within a third portion of the first layer;
   a metal content within the second portion is essentially stoichiometric and the metal content within the third portion is at most 20 atomic percent; and
   the second portion is in a range of approximately 2–10 times thicker than the first portion.

6. The process of claim 1, wherein the semiconductor content at each of the first location and the third location is at least 80 atomic percent.

7. The process of claim 1, wherein the first layer has a portion that has a metal content of at least 40 atomic percent.

8. The process of claim 1, wherein the step of forming the, first layer is performed using chemical vapor deposition.

9. The process of claim 8, wherein the step of forming the first layer is performed at a temperature in a range of approximately 350–475 degrees Celsius and a pressure less than one torr.

10. The process of claim 1, further comprising a step of forming a passivation layer over the first layer.

11. The process of claim 1, wherein:
    the step of forming the first layer is performed by sputtering; and
    the process further comprises annealing the first layer after the step of forming the first layer.

12. The process of claim 1, wherein:
    the insulating layer is a gate dielectric layer;
    the semiconductor device includes a memory array; and
    the process further comprising patterning the first layer to form a gate electrode.

13. A process for forming a semiconductor device comprising the steps of:

forming an insulating layer over a semiconductor device substrate; and forming a first layer over the insulating layer using a nitrogen-containing gas, wherein:
    the first layer includes a semiconductor, a metal, and nitrogen and has a metal content, a semiconductor content, and a nitrogen content; and
    the nitrogen-containing gas flows during at least a portion of the step but is terminated before completing the formation of the first layer.

14. The process of claim 13, wherein the nitrogen content is substantially zero at the second location.

15. The process of claim 13, wherein the step of forming the first layer is performed using chemical vapor deposition.

16. The process of claim 13, wherein:
    the insulating layer is a gate dielectric layer;
    the semiconductor device includes a memory array; and
    the process further comprising patterning the first layer to form a gate electrode.

17. The process of claim 13, further comprising at step of forming a passivation layer over the first layer.

18. The process of claim 13, wherein during the step of forming the layer, a second gas flows after the nitrogen-containing gas is terminated and before completing the formation of the first layer.

19. The process of claim 18, wherein the second gas includes argon.

20. The process of claim 18, wherein the second gas includes an ionized gas.

* * * * *